(12) United States Patent
Lewis et al.

(10) Patent No.: US 9,093,994 B2
(45) Date of Patent: Jul. 28, 2015

(54) METHOD FOR DETECTING A CORRELATION

(71) Applicants: Matthew Lewis, Reutlingen (DE); Eberhard Boehl, Reutlingen (DE)

(72) Inventors: Matthew Lewis, Reutlingen (DE); Eberhard Boehl, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/206,894

(22) Filed: Mar. 12, 2014

(65) Prior Publication Data

US 2014/0266473 A1 Sep. 18, 2014

(30) Foreign Application Priority Data

Mar. 12, 2013 (DE) .......................... 10 2013 204 272

(51) Int. Cl.
| | |
|---|---|
| *G06F 7/58* | (2006.01) |
| *H03B 29/00* | (2006.01) |
| *H03K 3/03* | (2006.01) |
| *H03K 3/84* | (2006.01) |

(52) U.S. Cl.
CPC .............. *H03K 3/0315* (2013.01); *G06F 7/588* (2013.01); *H03B 29/00* (2013.01); *H03K 3/84* (2013.01)

(58) Field of Classification Search
CPC ........... G06F 7/58; G06F 7/582; G06F 7/588; H03B 27/00; H03B 29/00; H03K 3/0315; H03K 3/0322; H03K 3/84; H03L 7/0995

USPC ................. 331/2, 44–46, 49, 55–57, 78, 172; 708/250, 251

See application file for complete search history.

(56) References Cited

U.S. PATENT DOCUMENTS

| | | | | |
|---|---|---|---|---|
| 5,134,371 | A | * | 7/1992 | Watanabe et al. .............. 324/252 |
| 7,330,080 | B1 | * | 2/2008 | Stoiber et al. .................... 331/57 |
| 7,495,519 | B2 | * | 2/2009 | Kim et al. ......................... 331/57 |
| 7,619,486 | B1 | * | 11/2009 | Lesea ............................. 331/176 |
| 8,421,663 | B1 | * | 4/2013 | Bennett ......................... 341/155 |
| 8,901,917 | B2 | * | 12/2014 | Chen et al. ................. 324/76.41 |
| 2005/0273290 | A1 | * | 12/2005 | Asano et al. .................. 702/117 |
| 2006/0069706 | A1 | * | 3/2006 | Lazich et al. ................. 708/251 |
| 2007/0250938 | A1 | * | 10/2007 | Suh et al. ......................... 726/34 |
| 2011/0181337 | A1 | * | 7/2011 | Otsuga et al. ................. 327/332 |
| 2013/0187708 | A1 | * | 7/2013 | Dang et al. .................... 329/312 |
| 2014/0191813 | A1 | * | 7/2014 | Sul et al. ......................... 331/46 |

FOREIGN PATENT DOCUMENTS

EP 1 686 458 8/2006

OTHER PUBLICATIONS

Bock, H. et al., "An Offset-Compensated Oscillator-Based Random Bit Source for Security Applications", CHES, pp. 268-281, 2005.
Bucci, M. et al., "Design of Testable Random Bit Generators", Ches, pp. 148-156, 2005.
Sunar, B. et al., "A Provably Secure True Random Number Generator with Built in Tolerance to Active Attacks", IEEE Trans. on Computers, vol. 56, No. 1, pp. 109-119, 2007.

* cited by examiner

*Primary Examiner* — Levi Gannon
(74) *Attorney, Agent, or Firm* — Kenyon & Kenyon LLP

(57) ABSTRACT

A method is described for detecting a correlation between at least two ring oscillators and to a system for carrying out the method. In the method a memory field is used in which combinations of concatenations are each assigned a bit.

11 Claims, 4 Drawing Sheets

METHOD FOR DETECTING A CORRELATION

FIELD OF THE INVENTION

The present invention relates to a method for detecting a correlation between at least two ring oscillators and to a system for carrying out the introduced method. The considered ring oscillators are used as random number generators.

BACKGROUND INFORMATION

Random numbers, which are referred to as the result of random elements, are required for many applications. So-called random number generators are used to generate random numbers. Random number generators are methods which supply a sequence of random numbers. A crucial criterion of random numbers is whether the result of the generation may be regarded as being independent of earlier results.

Random numbers are required for cryptographic methods, for example. These random numbers are used to generate keys for the encryption methods. Such keys are subject to high requirements in terms of the randomness properties. Pseudo random number generators (PRNG), for example, represented by a linear feedback shift register (LFRS), are therefore not suitable for this purpose. Only a true random number generator (TRNG) meets the requirements at hand. This generator uses natural noise processes to obtain an unpredictable result. Noise generators which use the thermal noise of resistors or semiconductors or the shot noise at potential barriers, such as at p-n junctions, are common. Another option is the use of radioactive decay of isotopes.

While "traditional" methods use analog elements, such as resistors, as noise sources, digital elements, such as inverters, have been used frequently in the more recent past. These have the advantage of lower complexity in the circuitry layout since these are available as standard elements. In addition, such circuits may also be used in freely programmable circuits, such as FPGAs.

For example, the use of ring oscillators which represent an electronic oscillator circuit is known. In these, an odd number of inverters is interconnected to form a ring, whereby an oscillation having a natural frequency is created. The natural frequency depends on the number of inverters in the ring, the properties of the inverters, the conditions of the interconnection, namely the line capacitances, the operating voltage and the temperature. Due to the noise of the inverters, a random phase displacement occurs as compared to the ideal oscillator frequency, which is used as a random process for the TRNG. It must be noted that ring oscillators oscillate independently and do not require any external components, such as capacitors or coils.

One problem with the use of randomness arises in that the ring oscillator must be sampled, preferably in the vicinity of an anticipated ideal edge to obtain a random sampled value. The publication by Bock, H., Bucci, M., Luzzi, R.: An Offset-compensated Oscillator-based Random Bit Source for Security Applications, CHES 2005, shows an option of how sampling is always carried out in the vicinity of an oscillator edge by the controlled shifting of the sampling point in time.

A method for generating random numbers with the aid of a ring oscillator is known from the publication European Patent No. 1 686 458, in which a first and a second signal are provided, the sampling of the first signal being triggered by the second signal. In the described method, a ring oscillator is sampled multiple times, always using only non-inverting delays, namely an even number of inverters as delay elements. Starting from a starting point, the oscillator ring is always sampled after an even number of inverters simultaneously or with mutual delay. In this way, the shift of the sampling point in time may be dispensed with; instead, the multiple sampling signals are evaluated.

The publication "Design of Testable Random Bit Generators" by Bucci, M. and Luzzi, R. (CHES 2005) introduces a method with which an influence on the random source may be detected. Attacks may thus be prevented. However, it does not allow a direct distinction between random values and deterministic values.

Another option is provided by the use of multiple ring oscillators. This is demonstrated in the publication Sunar, B. et al: Aproveable Secure True Random Number Generator with Built In Tolerance Attacks, IEEE Trans. on Computers, January 2007, for example. Here, sample values of multiple ring oscillators are concatenated to each other and evaluated.

The problem here is that correlations between the ring oscillators may occur, for example due to outside influences, so that the results obtained do not have a desired degree of entropy.

SUMMARY

With the introduced method, it is possible to ensure that a minimum entropy is always available, regardless of the sampling frequency. This is attributable to the fact that, if there is no correlation with each other, at least one oscillator also does not correlate with another reference clock, such as a system clock or frequency injection clock. The estimation of the entropy is made based on the assumption that the sample clock does not correlate with the oscillator clock. Only if uniformly distributed sampling over the oscillator period exists are the estimated entropy values achievable. If two oscillators in each case correlate with another clock, they also correlate with each other.

The introduced method makes it possible to detect whether a correlation between the ring oscillators exists, and thus to provide information about the degree of entropy. Threshold values may be predefined for this purpose, a correlation being established when these are reached or exceeded or when there is a threshold value shortfall.

Further advantages and embodiments of the present invention are derived from the description and the accompanying drawings.

It goes without saying that the above-mentioned features and those still to be described hereafter are usable not only in the particular described combination, but also in other combinations or alone, without departing from the scope of the present invention.

DETAILED DESCRIPTION

Figure 1:
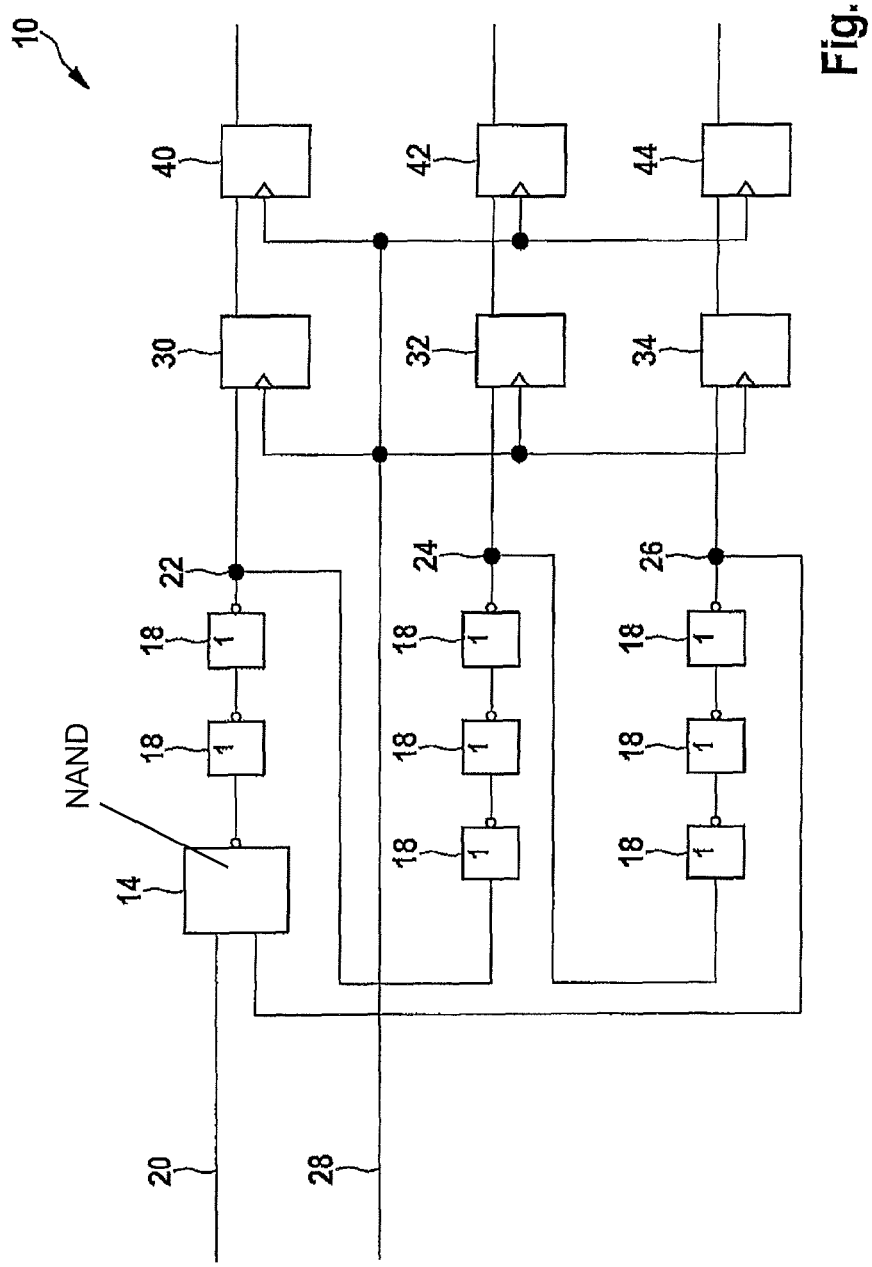
FIG. 1 shows one embodiment of a ring oscillator for carrying out the introduced method.

The present invention is shown schematically based on specific embodiments in the drawings and is described in greater detail hereafter with reference to the drawings.

FIG. 1 shows one embodiment of a ring oscillator for carrying out the described method, which overall is denoted by reference numeral 10. Ring oscillator 10 has a NAND gate 14 and eight inverters 18, and thus nine inverting elements. Ring oscillator 10 thus has an odd number of inverting elements and three taps or sampling points.

Ring oscillator 10 may be started and stopped using a first input 20. The illustration further shows a first sampling point 22, a second sampling point 24 and a third sampling point 26. The sampling rate is predefined via a second input 28. This means that, starting with first sampling point 22, sampling always takes place after an odd number of inverting elements. However, this is not absolutely necessary for the introduced method.

First sampling point 22 is sampled using a first flip flop 30, resulting in sampled value s10. Second sampling point 24 is sampled using a second flip flop 32, resulting in sampled value s11. Third sampling point 26 is sampled using a third flip flop 34, resulting in sampled value s12. Another fourth flip flop 40 is assigned to first flip flop 30. This fulfills a memory function and outputs value s10', which chronologically precedes value s10, i.e., s10 and 10' are chronologically consecutive sample values of first sampling point 22. Accordingly, a fifth flip flop 42, which outputs s11', is assigned to second flip flop 32, and a sixth flip flop 44, which outputs s12', is assigned to third flip flop 34. Flip flops 40, 42 and 44 are suitable for resolving metastable states of flip flops 30, 32 and 34. Metastable states are created by the signal at input 28 being switched while an edge is present at sampling point 22, 24 or 26. Flip flops 30, 32 and 34 then require a certain time until a stable final state is reached. In the present example, this time is ensured in that the, then stable, value of flip flops 30, 32 and 34 is not taken over into flip flops 40, 42 and 44 until the subsequent active edge of the signal is present at input 28.

In principle, ring oscillator 10 may thus be composed of nine inverters 18, for example. One of these inverters 18 may be replaced by NAND gate 14 to be able to stop ring oscillator 10. Alternatively, this NAND gate 14 may also be replaced by a NOR gate.

In the embodiment shown, the values of ring oscillator 10 are stored simultaneously in a particular flip flop (FF) 30, 32, 34 at three different inverters. These taps should be preferably uniformly distributed over the elements of ring oscillator 10. For this reason, a tap or a sampling point 22, 24, 26 is provided in each case after three inverting elements in the case of nine inverting stages in ring oscillator 10. As was already mentioned, however, this is not required for the introduced method. It is also possible to provide another tap after an even number of inverting elements.

The number of inverter stages in ring oscillator 10 determines the frequency of the oscillator and should therefore be selected in such a way that the flip flops are able to store the particular signal value. If a preferably high oscillator frequency is used, the probability of being in the vicinity of an edge during sampling is higher. For this reason, a preferably low number of inverters is selected in the oscillator ring, however, so many that the flip flops are operable for the attained frequency. For a 180 nm technology, a frequency of approximately 1 GHz was determined for ring oscillator 12 having nine inverters 18 with the aid of simulation. The flip flops are able to store the signal values at this frequency, as was demonstrated.

The introduced method may be carried out with ring oscillator according to FIG. 1, which has an odd number of inverting elements, values being tapped at at least two sampling points of the ring oscillator, and an odd number of inverting elements being located in each case between at least two directly consecutive sampling points.

A correlation with the system clock, and thus with the sample clock derived therefrom, may be established for ring oscillator 10. It is not possible to establish all correlations by the comparison of s10, s11, s12 with s10', s11', s12', even if the divisor value of the frequency divider is dividable by the number of the inverting elements in the oscillator ring. It may occur that sampling is carried out repeatedly at the same position in the oscillator cycle in each case after an arbitrary, for example constant, number of samplings. If this number is not simultaneously a divisor of the number of inverting elements in the oscillator, the above-described comparison does not provide any indication of the present correlation. It is still possible then to establish the correlation if all samplings are compared to the instantaneous sample. However, this is a very complex process.

When a ring oscillator is used in an FPGA, no option is available for influencing the frequency, such as by lowering the operating voltage of the oscillator using a resistor. It is therefore proposed, in particular for FPGAs, to use two ring oscillators which monitor each other and whose outputs are concatenated to each other. A correlation of these two oscillators is detectable, but not necessarily preventable. The correlation may be the result of coupling between the two oscillators, a shared correlation with the system clock, or an attack. It is assumed that diversity exists due to the different line delays in the two FPGA oscillators, the diversity ensuring a marginally different frequency. However, this is even more difficult to ensure in an ASIC. An attack is detected when the frequency of the two becomes exactly identical.

If correlations exist which result from a shared divider frequency, which is caused, for example, by a so-called frequency injection attack, then they are not detected. It is therefore proposed to use two oscillators having different numbers of inverting elements, or at least to design the oscillators in such a way that a considerably deviating target frequency is achieved. The two oscillators should preferably have the same number of taps, such as 3, which are preferably uniformly distributed over the oscillator elements, and the number of inverting elements between two taps should in each case differ, for example, by an even number, such as 2. If the one oscillator has nine inverters, the second oscillator should have fifteen.

Figure 2:
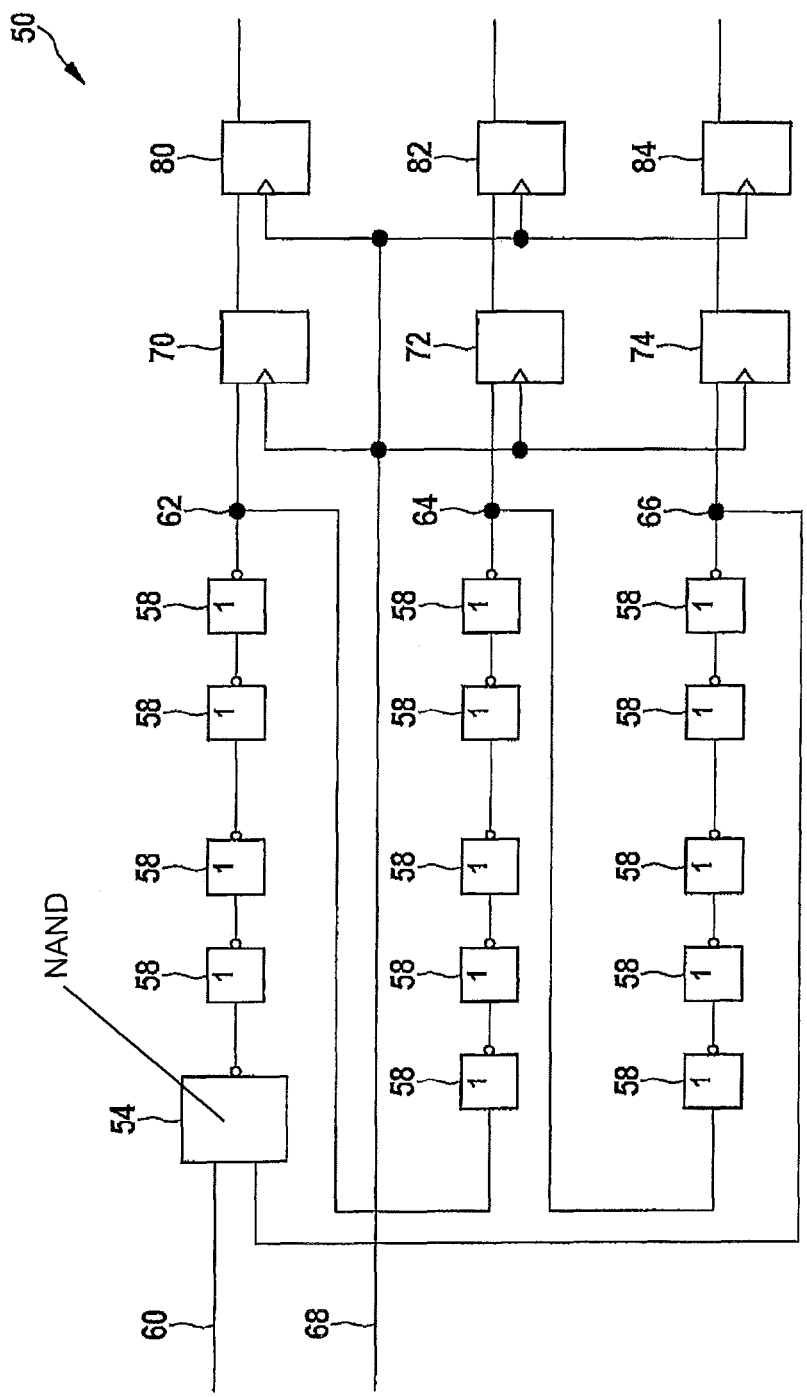
FIG. 2 shows another embodiment of the ring oscillator.

FIG. 2 shows such a ring oscillator 50 having one NAND gate 54 and fourteen inverters 58, and thus has fifteen inverting elements. Ring oscillator 50 is started and stopped using a first input 60. The illustration further shows a first sampling point 62, a second sampling point 64 and a third sampling point 66. The sampling rate is predefined via a second input 68.

A first flip flop 70 outputs sampled value s20, a second flip flop 72 outputs sampled value s21, and a third flip flop 74 outputs sampled value s22. In accordance with the embodiment of FIG. 1, a fourth flip flop 80 outputs value s20', a fifth flip flop 82 outputs value s21', and a sixth flip flop 84 outputs value s22'.

Figure 3:
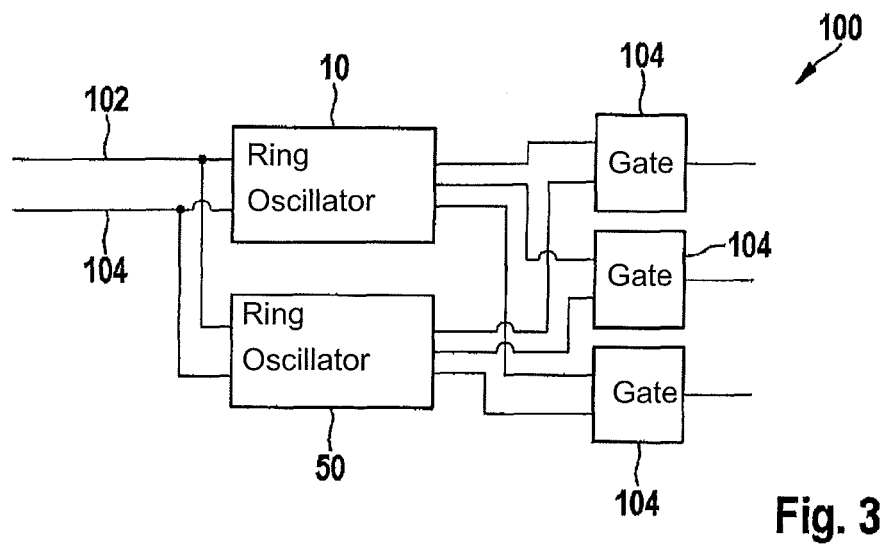
FIG. 3 shows a possible interconnection of two ring oscillators.

FIG. 3 shows a system 100 for concatenating or interconnecting to ring oscillator 10 of FIG. 1 and to ring oscillator 50 of FIG. 2, having a first input 102 for starting and a second input 104 for predefining the sample clock.

The outputs of two ring oscillators 10 and 50 are concatenated to each other at the corresponding positions using the bitwise XOR operation (gates 104, exclusive OR operation). However, it is also possible that the outputs are included independently of each other in the so-called post processing.

The two ring oscillators 10 and 50 have the same sample clock but, if necessary, different start signals to also have the option of using only one ring oscillator 10 or 50, or of checking only one. This is useful for saving electricity or for certification. First flip flops 30, 32, 34 or 70, 72, 74 having designations si0, si1 and si2 are used to resolve metastable states. Only outputs si0', si1' and si2' are used as stable outputs. The number of inverting elements in two ring oscillators 10 and 50 should preferably be dividable by the number of taps, so that a uniform distribution of the taps is achievable. Ring oscillator 10 or 50 having the lower number of inverting elements typically has a higher frequency; however, this should be selected for the technology which is used in such a way that the flip flops which are used are able to follow this frequency well. It should be noted that the dimensioning of these elements is typically optimized for the switching speed when using standard digital elements, such as inverters, NAND and flip flop. As a result, however, these elements have unequal drive strengths for the two edges 0-1 and 1-0. Typically, the charging of a network node, of a line or of an internal state of a flip flop takes longer than its discharge. With uniform sampling, a low value would be sampled more frequently at the internal flip flop node than a high value. If the output of the flip flop is formed by inversion of the internal node, a high value results there more frequently. Such a shift of the probabilities for 0 and 1 (low and high) is referred to as bias. As long as sampling areas exist for an oscillator period for which a 0 would be sampled and for which a 1 would be sampled, this shift has no impact on the entropy value as long as the areas of the edges with their jitter do not overlap. While the probabilities for 0 and 1 are different, the value that is obtained is always dependent on the jitter, and thus on the noise, when sampling is carried out during an edge in the jitter area. Under otherwise equal conditions, a different value may be sampled in each case at an edge at the same point of time.

It should be noted that ring oscillator 50 has a considerably lower natural frequency than ring oscillator 10.

Using the following values for ring oscillator i:
fi: frequency of oscillator i
ni: number of inverting elements in oscillator i
the frequency ratios may be roughly estimated using $n1*f1 = n2*f2$ or $f2 = f1*n1/n2$.

In the concrete case, f2=9/15*f1. If f1=1 GHz, then f2=600 MHz follows.

The greatest common divisor of f1 and f2 is 200 MHz. Theoretically, the two ring oscillators 10 and 50 could be influenced with any frequency which corresponds to an integral part of 200 MHz, if this frequency were impressed onto the supply voltage of the oscillators. Often times it is already sufficient if the supply voltage does not exceed the specified limiting values of the operating voltage for operation.

In general, a frequency of ⅕ of the fast frequency, which should be ⅓ of the slow frequency, is always a suitable manipulation basis for 9 or 15 inverters. By feeding this frequency to the supply voltage of the two oscillators, the two could oscillate at a multiple of this frequency (5-fold or 3-fold), and any jitter could thus be eliminated. This would be disadvantageous, since then the randomness, and thus the obtained entropy, would move toward zero. It is therefore useful to detect this state.

A method should therefore be provided with which it is possible to establish the correlation between these two oscillators when the frequency of the oscillators is equal. However, this presupposes that the nominal frequency of the two oscillators is similar in magnitude. Although this method is suitable in particular for FPGA implementations, the same methodology is also usable for ASIC implementations.

Such a method is not effective for the case of deviating oscillator frequencies. In the above-mentioned example using 1 GHz and 600 MHz, stimulation using 200 MHz could ensure that the two oscillators correlate, without being able to detect this. This is the case since there are exactly 5 identical states of ring oscillator 10, within a 200 MHz period, in which ring oscillator 50 has different sample values in each case. One may now attempt to store these 5 values, and to compare the instantaneous sampled value to each of the stored values. This, on the one hand, is very complex, and, on the other hand, not general enough: it only results in success if the divisor factor 5 is present between the oscillator frequency and the partial frequency. However, in general a possible divisor factor is not exactly known, or several such factors exist. For example, an attacker could attempt to attack using 122.5 MHz and thereby pull oscillator 1 to 980 MHz and oscillator 2 to 612.5 MHz. To detect this, the factor 8 would additionally have to be considered in OSC 1. This is practically impossible, or only ensurable with unreasonably high complexity.

A method is therefore proposed which operates independently of the frequencies of the oscillators. It is assumed that all possible configurations of the two oscillators with respect to each other may occur with a non-correlation of the frequencies. The state of the two oscillators at a sampling point is determined by the values s00', s01', s02', s10', s11' and s12'. In a memory field having 64 bits, one bit is assigned to each of these $2^6$ configurations or combinations. This bit is initially set to 0, for example. This memory field is illustrated by Table 1 below:

TABLE 1

| | 000[1] | 001[1] | 011[1] | 100[1] | 000[1] | 101[1] | 110[1] | 111[1] |
|---|---|---|---|---|---|---|---|---|
| 000[2] | 0 | 0 | 0 | 0 | 0 | 0 | 0 | 0 |
| 001[2] | 0 | 0 | 0 | 0 | 0 | 0 | 0 | 0 |
| 010[2] | 0 | 0 | 0 | 0 | 0 | 0 | 0 | 0 |
| 011[2] | 0 | 0 | 0 | 0 | 0 | 0 | 0 | 0 |
| 100[2] | 0 | 0 | 0 | 0 | 0 | 0 | 0 | 0 |
| 101[2] | 0 | 0 | 0 | 0 | 0 | 0 | 0 | 0 |
| 110[2] | 0 | 0 | 0 | 0 | 0 | 0 | 0 | 0 |
| 111[2] | 0 | 0 | 0 | 0 | 0 | 0 | 0 | 0 |

Initial values of the memory block or field for two oscillators using [1]sampling of ring oscillator 10 and [2]ring oscillator 50.

The memory field may be implemented as a register field or also as part of a RAM. It should be noted that 000 and 111 may also occur for the sample values, and memory space is therefore set up for this. Due to imbalances in the ring oscillator, such as those due to different inverting elements, different loads, line lengths and therefore parasitic elements, or distortions due to different edge steepness levels of the signals in the ring oscillator, or in the flip flops, as well as clock imprecisions at the sampling flip flops, the values 000 and 111 are noted. Only when ideal switching elements having equal drive strengths for the two edges are used, and the conditions as described above are idealized in the layout, may 000 and 111 be excluded.

Figure 4:
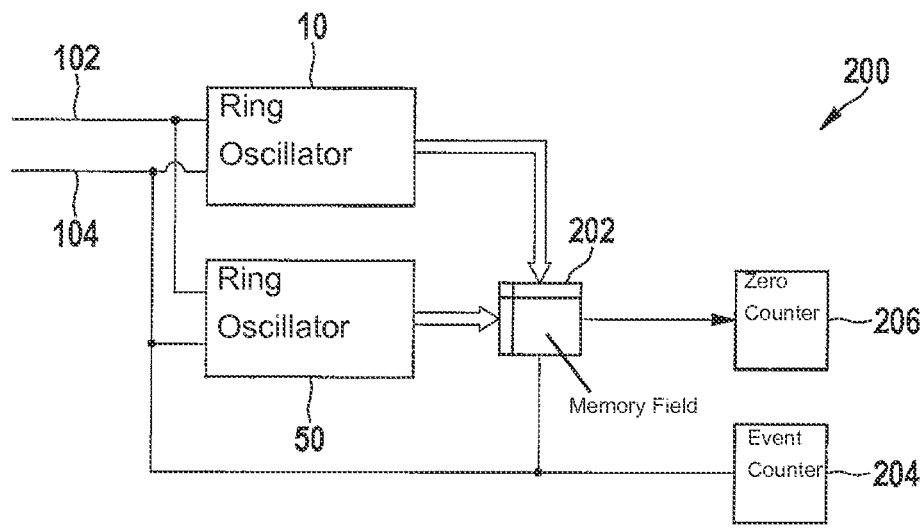
FIG. 4 shows one embodiment of the introduced system, which is used to establish or detect the correlation between two ring oscillators.

FIG. 4 shows one embodiment of introduced system 200, which is supplemented from the system of FIG. 3 and includes a memory field 202 and two counters, namely the event counter ZE 204 and the zero counter ZN 206. Memory field 202 is stored in a memory element or block, such as a RAM. All memory cells are initialized using the value 0.

Initially, the two counters ZE 204 and ZN 206 are set to 0. With each new sample clock, the sample values at the output of ring oscillators 10 and 50 are used to read the memory cell addressed thereby and to then write 1 to the same. If a zero is present at the particular memory location, zero counter ZN 206 is incremented and the memory location is set to the value 1. It is always possible to read from this counter how many different combinations of the two samplings have previously occurred. Its maximum value is 64. At the same time, event counter ZE 204 is incremented with every sample clock. If this counter has 16 bits, for example, an overflow will occur after 65536 samples. Before the overflow is reached, an evaluation may be carried out at any arbitrary location and then ZN may be reset. If event counter 204 has only 8 or 10 bits, for example, instead of 16 bits, an evaluation is carried out sooner, and a larger number of tests is thus possible during the same time period.

If the values of ZN 206 are high, no correlation exists between the oscillators. A correlation also does not necessarily exist even at small values. It could be an indication that one oscillator does not oscillate at all, but always supplies constant output values. Only entries in one cell or column of the memory block of Table 1 are then obtained. For this reason, at least one ring oscillator could still supply sufficient entropy.

It is therefore advantageous to monitor the two ring oscillators individually in a similar manner. It is determined how many assignments of the 3 sample bits even occur. For this, a memory field according to Table 2 below is needed.

TABLE 2

|  | 000[1] | 001[1] | 011[1] | 100[1] | 000[1] | 101[1] | 110[1] | 111[1] |
|---|---|---|---|---|---|---|---|---|
| Initial value | 0 | 0 | 0 | 0 | 0 | 0 | 0 | 0 |

Initial values of the memory field for a ring oscillator: using [1]sampling of ring oscillator.

Figure 5:
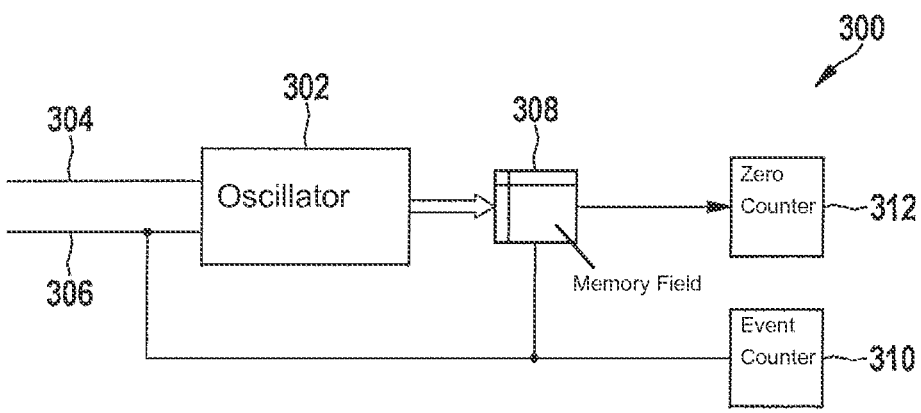
FIG. 5 shows another system for monitoring two oscillators for detecting a correlation.

Additionally, circuit system 300, as is shown in FIG. 5, is needed for each oscillator 302. The illustration further shows a first input 304, a second input 306, a memory field 308, an event counter ZE 310 and a zero counter ZNi 312.

Event counter ZE 310 need not be implemented again for this purpose. It is possible to use a shared counter for all three circuits, and in particular for the first ring oscillator, the second ring oscillator and the sum of the two. In the evaluation, it is examined whether an oscillator has low ZNi values. Several possible interpretations of the results are described in Table 3.

For example, if ZNi values <6 are present for the two oscillators, it is initially be assumed that the two correlate with the sample clock. However, a correlation between each other is rather unlikely if the value of ZN (206 according to FIG. 4) is greater than the greatest ZNi (312 according to FIG. 5) and is closer to the product of ZN1 and ZN2. A warning may be issued as a function of a shortfall with respect to a predefined threshold for ZN, ZN1 and/or ZN2. If Zni=0 or =1, a fault is displayed if the corresponding oscillator was not intentionally deactivated. The test is restarted after the counter has been reset. Warnings increment a warning counter. When the warning counter reaches a certain threshold value, it may be attempted to influence the oscillator frequencies, such as by additional capacitances or influence on the operating voltage of the oscillator. When a further threshold value is reached, a fault signal is generated.

Table 3 below illustrates the evaluation of the correlation of a ring oscillator with the sample clock.

TABLE 3

Evaluation of the monitoring of the correlation of a ring oscillator with the sample clock;

Zni Correlation with the sample clock (probable cause)

0  Circuit defective
1  Oscillator stopped (start = 0) or correlation at one point
2  Correlation with sample clock at 2 points
3  Correlation with sample clock at 3 points
4  Possible correlation with sample clock at 4 points or distortion due to asymmetrical switching elements[3]
5  Possible correlation with sample clock at 5 points or distortion due to asymmetrical switching elements[3]
6  Potentially correlation-free if two states may be excluded[1][2]
7  Potentially correlation-free if one state may be excluded[1][2]
8  Correlation-free

[1]Due to distortions, arbitrary other exclusion values than 000 or 111 are possible
[2]If random bit values are considered in the examination, a correlation may also exist in which the samplings partially take place in the vicinity of an edge
[3]If due to implementation conditions, as described above, at most one bit may be 0, for example, in the 3 sample values, or if at most one bit is 1; such values were also metrologically determined using a test chip In one embodiment of the present invention, a method according to FIG. 5 is used in each case for the two oscillators, and in parallel to this, a shared method according to FIG. 4 is used.

A correlation is certain not to exist when the value ascertained by counter ZN 206 results from the product of counter values Zni 312 of the two oscillators.

A correlation is certain to exist when the value of ZN 206 is not greater than the highest value of ZNi 312 of one of the two oscillators; in this case, a corresponding, in each case constant, value of the second oscillator exists for the same starting value of an oscillator.

A correlation is assumed, for example, in all other cases.

In one further embodiment of the present invention, the monitoring of an oscillator according to Tables 2 and 3 as well as FIG. 5 may also be carried out when only one ring oscillator is present or used. The possibility exists to save energy when two oscillators are present; however, one already satisfies the test in question. The start signal of the other oscillator may then be set to 0. It is also possible to use the method according to FIG. 4 for this purpose, if only one oscillator is activated.

In one further embodiment of the method, the method according to FIG. 5 may also be dispensed with, if the method according to FIG. 4 is used for each of the two oscillators consecutively and only the one or the other oscillator is activated in the process. The two Zni values are thus determined in counter 206. Thereafter, the ZN value is determined when the two oscillators are active.

In one further embodiment of the present invention, it is possible to establish in the memory field that a particular sample configuration has not only occurred, namely at least once, but also to count the number of each occurrence. For this purpose, not only one bit is stored in the addressed memory cell, which allows the occurrence to be detected, but the occurrence is counted using 8 or more bits. For this purpose, the memory location is read, incremented and written back during the occurrence. If the memory cell has fewer bits than the event counter, counting should not continue when the maximum value (all ones) has been reached. After the end value has been reached in the event counter, it is then possible, for example, to establish whether the occurrence of the sample configurations in question reaches a minimum value.

Moreover, it is possible to establish by the comparison of the incremented values whether certain samplings occur more frequently than others, or also whether something has changed in the distribution (as compared to long-term mean values). This could be used to discover manipulations.

In one further embodiment of the present invention, when using two oscillators it is possible to achieve a considerably different frequency even if the number of inverters is the same, for example if:
a) different inverters or inverting elements are used, which have a different drive capability and/or a different intrinsic delay due to a different layout, and thus different parameters of parasitic elements;
b) NAND gates, NOR gates or complex gates are used instead of inverters;
c) fixed values are applied to the free inputs of the elements of b), or of an inverting element of the oscillator, such as a parallel connection to the other input; this influences the load capacity;
d) additional capacitances or extended lines are used in one oscillator.

This embodiment has the advantage that the frequencies of the oscillators potentially do not deviate as drastically from each other. As a result, the entropy, namely the randomness component, increases since the frequency of the one ring oscillator is not unnecessarily reduced to, e.g., 60% of the other ring oscillator. For an estimation of the entropy, the most unfavorable case would have to be considered, and thus the slowest ring oscillator.

The described method for correlation detection has the advantage, even with one oscillator, that one may assume, in the case of the non-correlation according to Table 3 for the entropy estimation, that all sampling points of time within one oscillator period are equiprobable. This way, considerably higher entropy values are obtained. If additionally the sample clock is derived from the system block with the aid of integer division, it is also possible to detect correlations with the system clock according to Table 3.

One possible implementation is as follows:
1. Implement two oscillators which differ from each other in the frequency to be expected due to their design or as a function of the implementation.
2. Test the two oscillators independently from each other using the method according to Tables 2 and 3 as well as FIG. 5.
3. Decide whether one ring oscillator is sufficient to ensure the required entropy.
4. If two ring oscillators are necessary, carry out the test of Table 1 and FIG. 4 and, if necessary, in parallel that of Table 2 and FIG. 4, for the two oscillators.
5. If possible, deactivate one oscillator, in particular if the test of the remaining oscillator according to Table 3 shows the evaluation "correlation-free," and the entropy of one oscillator is sufficient in this case (save energy).
6. Carry out the test of the ring oscillators continuously and decide whether, if necessary, one oscillator has to be connected again.
7. If two ring oscillators are used, concatenate their outputs according to FIG. 3 or process these independently with the aid of post processing.

The introduced system may include at least one ring oscillator, which has an odd number of inverting elements and which is sampled in at least two positions, the instantaneous states of the particular oscillator at these sampling points being stored in memory elements, these being directly or indirectly connected to outputs, and these outputs being connected to at least one testing device. This testing device includes a memory system whose memory elements are composed of at least one bit. Initially, the memory elements are set to the value 0 or another initial value which is identical for all memory elements, the outputs of at least one of the oscillators being used as the address of the memory system and, with every output value, the memory element in question being read first with each output value and then set to 1 or the inverse initial value, or being incremented or decremented.

Moreover, an event counter may be incremented with each reading, and at least one additional initial value counter may be incremented when reading the value 0 or the initial value.

Moreover, after a predefined value has been reached in the event counter, it may be checked whether the initial value counter has a predefined minimum value, and a warning may be issued in the event of non-fulfillment and thereafter, if necessary, the event counter and the initial counter may be reset, and another test may be started.

It may further be provided that a warning counter is incremented if a warning is issued, and that this warning counter is reset if no warning is generated during a test. A fault may be issued when a predefined minimum value of the warning counter is reached.

What is claimed is:

1. A method for detecting a correlation between at least two ring oscillators, comprising:
sampling the ring oscillators using the same sample clock;
concatenating values sampled during each sampling in each case to each other at outputs of the ring oscillators, each sampling during which a concatenation is made representing an event, and a number of possible combinations resulting for the concatenations;
defining a memory field in which the possible combinations of the concatenations are assigned in each case to at least one bit in the memory field, at a beginning each bit being set to a starting value, each event causing an event counter to be incremented, and the assigned bit being overwritten during a first-time occurrence of each of the possible combinations of the concatenations, each overwriting of a starting value causing a zero counter to be incremented; and
evaluating a value of the zero counter for detecting a correlation.

2. The method as recited in claim 1, further comprising incrementing the assigned bit during the first-time occurrence of each of the possible concatenations.

3. The method as recited in claim 1, wherein the ring oscillators include two ring oscillators that are tested separately.

4. The method as recited in claim 3, results of the test of the individual ring oscillators are taken into consideration in the determination of the number of possible combinations.

5. The method as recited in claim 1, further comprising:
detecting a correlation among three ring oscillators in that the sampled values of all three ring oscillators are concatenated to each other, wherein the memory field is used in which possible combinations of the concatenations are in each case assigned at least one bit in the memory field.

6. The method as recited in claim 5, wherein the three ring oscillators are individually considered, and the results are taken into consideration in the determination of the number of possible combinations.

7. The method as recited in claim 1, further comprising issuing a warning when a correlation is detected.

8. A system for detecting a correlation between at least two ring oscillators, further comprising:
a memory field; and at least one first counter and at least one second counter, the first counter being used as an event counter and the second counter being used as a zero counter, wherein the system:
- samples the ring oscillators using the same sample clock,
- concatenates values sampled during each sampling in each case to each other at outputs of the ring oscillators, each sampling during which a concatenation is made representing an event, and a number of possible combinations resulting for the concatenations,
- defines the memory field in which the possible combinations of the concatenations are assigned in each case to at least one bit in the memory field, at a beginning each bit being set to a starting value, each event causing the event counter to be incremented, and the assigned bit being overwritten during a first-time occurrence of each of the possible combinations of the concatenations, each overwriting of a starting value causing the zero counter to be incremented, and
- evaluates a value of the zero counter for detecting a correlation.

9. The system as recited in claim 8, wherein the first and the second counter are assigned to each ring oscillator.

10. The system as recited in claim 8, wherein exactly one first and exactly one second counter are provided.

11. The system as recited in claim 8, further comprising a table that assigns counter readings and is for detecting a correlation.

* * * * *